(12) United States Patent  (10) Patent No.: US 8,585,243 B2
Hamby et al.  (45) Date of Patent: Nov. 19, 2013

(54) LED LIGHTING APPARATUS, SYSTEMS AND METHODS OF MANUFACTURE

(75) Inventors: David W. Hamby, Andover, MA (US); Adam M. Scotch, Amesbury, MA (US); John H. Selverian, North Reading, MA (US)

(73) Assignee: OSRAM Sylvania Inc., Danvers, MA (US)

( * ) Notice: Subject to any disclaimer, the term of this patent is extended or adjusted under 35 U.S.C. 154(b) by 360 days.

(21) Appl. No.: 13/170,256

(22) Filed: Jun. 28, 2011

(65) Prior Publication Data

US 2013/0003373 A1    Jan. 3, 2013

(51) Int. Cl.
   *F21V 29/00*    (2006.01)
(52) U.S. Cl.
   USPC ............. 362/249.02; 362/294; 362/373
(58) Field of Classification Search
   USPC ................. 362/249.02, 294, 373
   See application file for complete search history.

(56) References Cited

U.S. PATENT DOCUMENTS

| | | | | |
|---|---|---|---|---|
| 7,284,882 | B2 * | 10/2007 | Burkholder | 362/294 |
| 7,800,124 | B2 * | 9/2010 | Urano et al. | 257/98 |
| 8,480,267 | B2 * | 7/2013 | Hamby et al. | 362/311.02 |
| 2003/0067775 | A1 | 4/2003 | Nagai et al. | |
| 2005/0207165 | A1 | 9/2005 | Shimizu et al. | |
| 2009/0026913 | A1 | 1/2009 | Mrakovich | |
| 2009/0323332 | A1 | 12/2009 | Lo et al. | |
| 2010/0066229 | A1 | 3/2010 | Hamby et al. | |
| 2010/0067229 | A1 | 3/2010 | Scotch et al. | |
| 2010/0079059 | A1 | 4/2010 | Roberts et al. | |
| 2010/0123855 | A1 | 5/2010 | Shin | |
| 2010/0177519 | A1 * | 7/2010 | Schlitz | 362/294 |
| 2010/0291313 | A1 | 11/2010 | Ling | |
| 2011/0031516 | A1 | 2/2011 | Basin et al. | |
| 2011/0065218 | A1 | 3/2011 | Tudhope et al. | |
| 2011/0089805 | A1 * | 4/2011 | Betsuda et al. | 313/46 |

FOREIGN PATENT DOCUMENTS

| | | |
|---|---|---|
| DE | 202009008928 | 10/2009 |
| JP | 2001-338505 | 12/2001 |
| WO | WO 2004/071143 | 8/2004 |
| WO | WO 2010/104275 | 9/2010 |

OTHER PUBLICATIONS

AMP Low Profile Edge Connectors, Catalog 1307612, Jul. 2001.
Excerpt from webpage, http://support.dell.com/support/edocs/systems/ws620/en/ug/boards.htm#expansion_cards.
Osram, Kreios D and Kreios T Brochure (2009).
Lumberg, Direct Connectors for Printed Circuit Boards, Nov. 2011.
Mole-Richardson Co., Mole LED Brochure.
Abstract, JP 2001-338505.
U.S. Appl. No. 13/170,265, filed Jun. 28, 2011.

* cited by examiner

*Primary Examiner* — Peggy A. Neils
(74) *Attorney, Agent, or Firm* — Robert F. Clark

(57) ABSTRACT

A light emitting diode (LED) lighting system including a lighting apparatus comprising at least one printed circuit board having an array of light emitting diode (LED) chips mounted thereto, the printed circuit board including a segmented conductor pathway configured to electrically couple at least a portion of the array of LED chips, and a portion of the printed circuit board forming a card edge connector, the card edge connector including a portion of the segmented conductor pathway which provides an electrical contact configured to electrically couple the segmented conductor pathway to a power source.

19 Claims, 13 Drawing Sheets

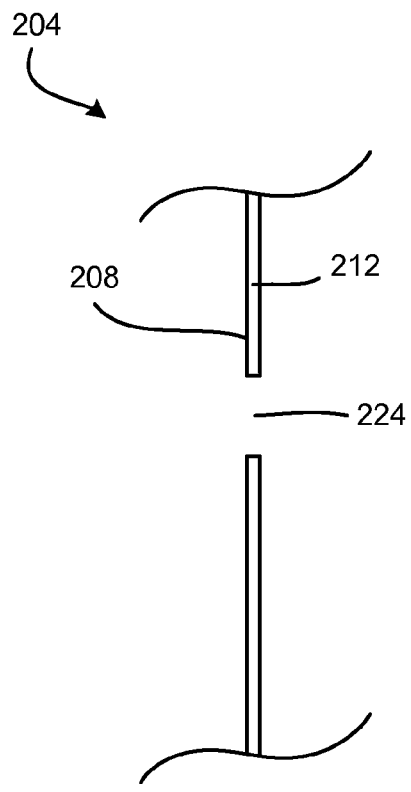
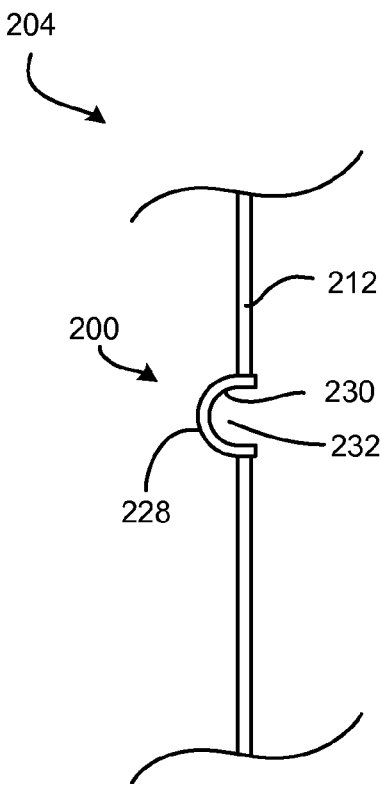
FIG. 12   FIG. 13
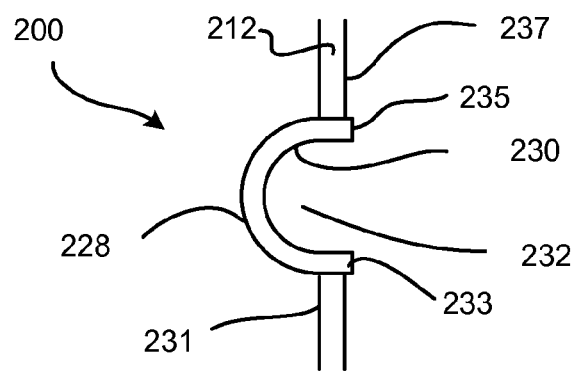
FIG. 13A

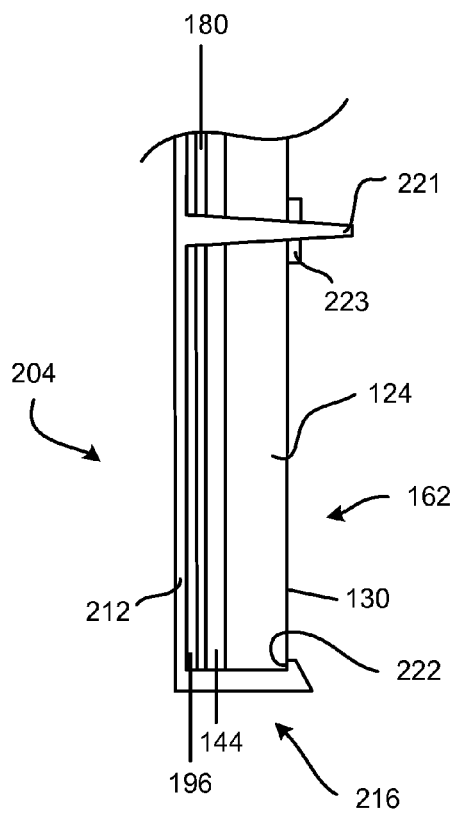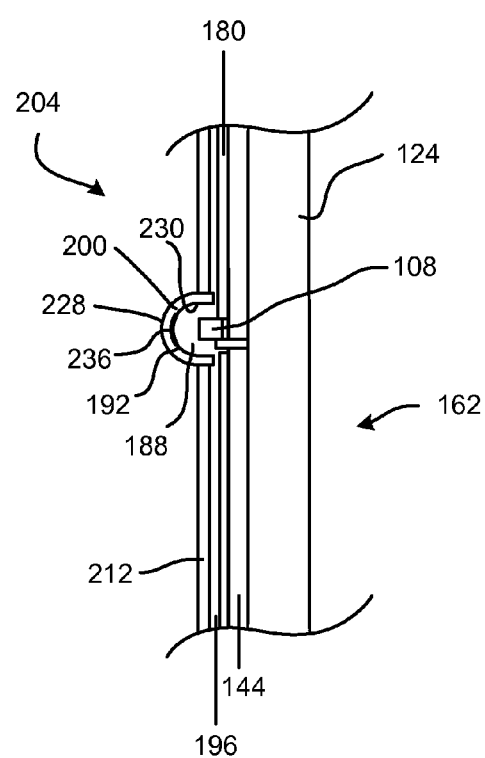
FIG. 14                FIG. 15

LED LIGHTING APPARATUS, SYSTEMS AND METHODS OF MANUFACTURE

FIELD

The present disclosure relates to light emitting diode (LED) lighting apparatus, LED lighting systems and methods of manufacture thereof.

BACKGROUND

An LED light engine may include an LED chip and may be configured to emit light of a color other than a color emitted by the LED chip. For example, a phosphor may be used to convert the light emitted from the LED chip to produce a desirable emission color. The particular phosphor may be selected depending on the wavelength emitted by the LED chip, and the overall color/wavelength of the light to be emitted by the light engine.

In one configuration, for example, a blue light LED chip may be combined with an LED optic made of a clear (transparent) polymer having a relatively high index of refraction, such as silicone. A phosphor (for example, a YAG:Ce phosphor) that converts the blue light from the LED chip having a first wavelength range to yellow light having a second wavelength range may be mixed with the polymer to provide volumetric blue light conversion. The yellow light emitted by the phosphor may combine with the residual unconverted blue light from the LED chip to produce an overall white emission from the LED light engine.

A portion of the light passing through the phosphor may undergo a Stokes shift as it is converted from one wavelength range to another wavelength range. Thus, phosphor-based LEDs may exhibit a lower efficiency than certain other LEDs due to the heat loss from the Stokes shift. Moreover, the proximity of the phosphor to the LED chip may lead to degradation of the package due to the heat produced by the LED chip and by the Stokes shift. Nevertheless, the phosphor method is a popular technique for manufacturing white LEDs. Accordingly, LED light engines, particularly those that produce white light, require thoughtful design.

Manufacture of LED light engines configured to emit light of a color other than a color emitted by the LED chips may be labor and time intensive. For an apparatus having a plurality of such LED light engines, each LED light engine may be assembled by separately attaching each LED optic to an associated LED chip. This is a time-consuming process and has the potential to damage the LED chip, as well as the electrical connections thereto, resulting in poor yield. Automation of attachment of the LED optic, such as with a robot or other pick-and-place equipment, may decrease assembly time, but may still be too slow for commercial viability. Additionally, installation and removal of LEDs in end-use applications may also be labor and time intensive, which also may expose the LED apparatus to potential damage.

BRIEF DESCRIPTION OF THE DRAWINGS

Reference should be made to the following detailed description which should be read in conjunction with the following figures, wherein like numerals represent like parts:

FIG. 12 is a schematic cross-sectional view of an aperture of the carrier of the cover taken along line 12-12 of FIG. 10;

FIG. 13 is a schematic cross-sectional view of the aperture of the carrier of the cover occupied by and containing a second optic element;

FIG. 13A is an enlarged schematic cross-sectional view of the aperture of the carrier of the cover occupied by and containing a second optic element;

FIG. 14 is a schematic cross-sectional view of the lighting apparatus of FIG. 1 taken along line 14-14 of FIG. 1;

FIG. 15 is a schematic cross-sectional view of the lighting apparatus of FIG. 1 taken along line 15-15 of FIG. 1;

DETAILED DESCRIPTION

Generally, LED lighting apparatus, systems and methods of manufacture thereof are provided herein which may improve the art of LED lighting, which may include increasing the ease of manufacture and assembly, as well as installation and removal from end use applications.

Figure 1:
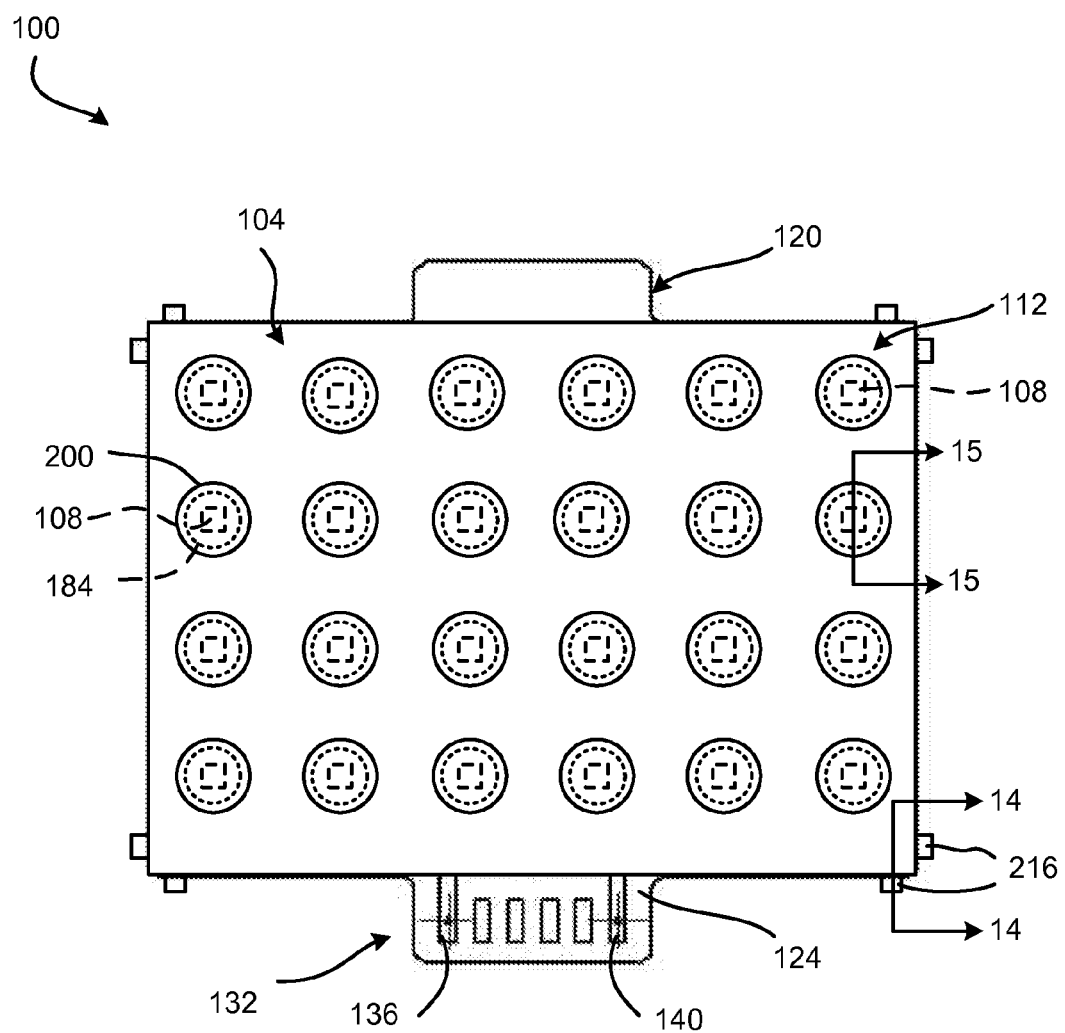
FIG. 1 is a schematic front plan view of a representative LED lighting apparatus consistent with the present disclosure.

FIG. 1 illustrates an exemplary light emitting diode (LED) lighting apparatus 100 consistent with the present disclosure. The LED lighting apparatus 100 includes a plurality of LED light engines 104 arranged in an array. The array is an orderly geometric pattern, particularly including a plurality of rows of the LED light engines 104. In the illustrated exemplary embodiment, the LED lighting apparatus 100 includes a 6×4 (6 columns and 4 rows) array of the LED light engines 104, however the array may be any suitable arrangement of a plurality of LED light engines 104 useful in a particular application.

Each LED light engine 104 includes an LED optic 112 which overlies an LED chip 108. The LED optic 112 includes a first optic element 184 and a second optic element 200. The first optic element 184 overlies the LED chip 108, while the second optic element 200 overlies the first optic element 184.

The first 184 and/or second optic 200 optic element may include a phosphor or mixture of phosphors configured for converting at least a portion of the light output of the LED chip 108 having a first wavelength to a light output from the light engine having a second wavelength.

In one embodiment, for example, the phosphor(s) in the LED optic may convert blue light output from the LED chip 108 to a second wavelength to produce an overall white light output from the LED light engines 104. The term "white light" as used herein refers to an output that exhibits a correlated color temperature (CCT) in the range from 2600-8000K However, the LED light engines 104 may also be configured to provide light other than white light.

Figure 2:
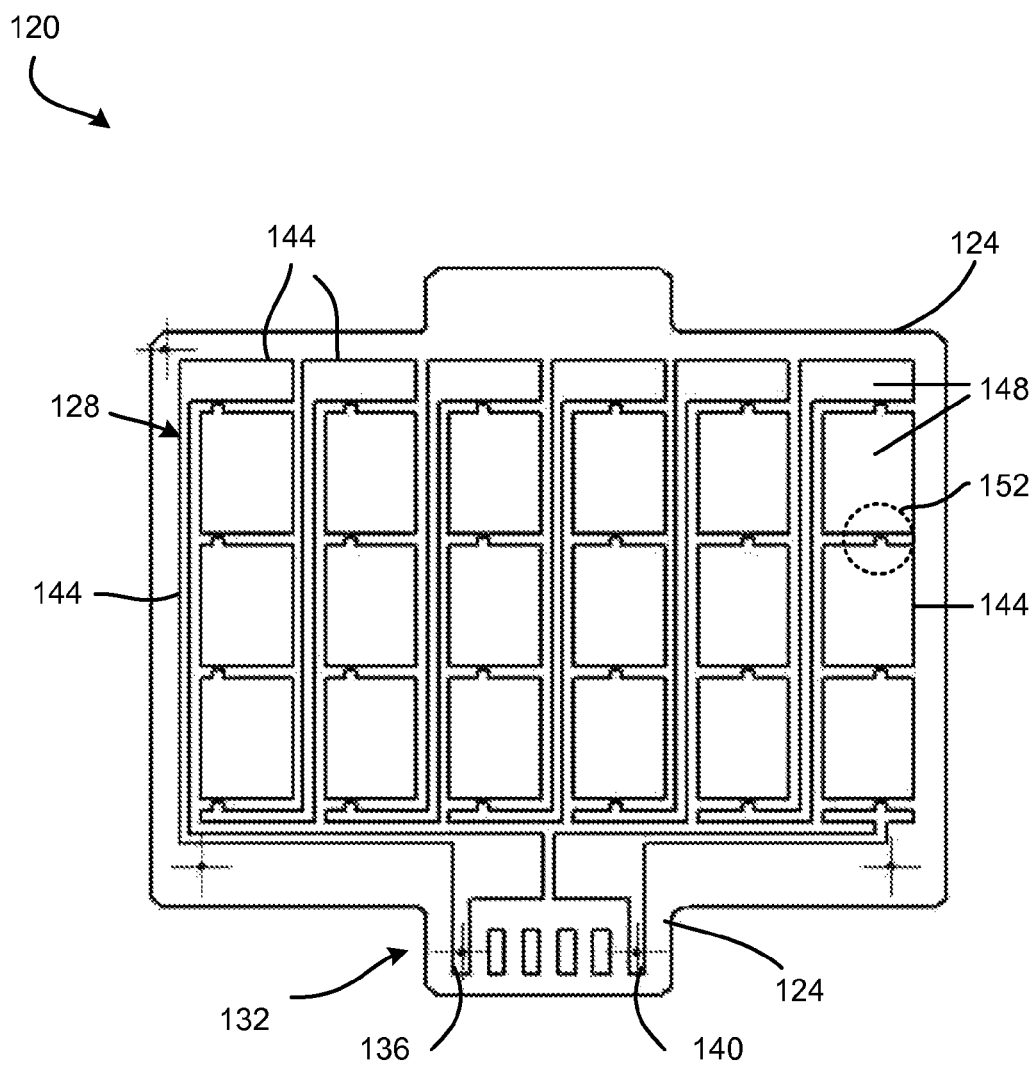
FIG. 2 is a schematic front plan view of a printed circuit board of the representative LED lighting apparatus of FIG. 1.

The construction, as well as methods to manufacture the LED lighting apparatus 100 of the present disclosure will now be discussed in detail. Referring now to FIG. 2, there is illustrated a printed circuit board (PCB) 120, which may also be referred to as a printed wiring board or etched wiring board. The printed circuit board 120 includes an electrically non-conductive, rigid, planar substrate 124 used to mechanically support the LED light engines 104 (FIG. 1), particularly the array of the LED chips 108 to be mounted thereto, as well as at least one segmented conductor pathway 128 configured to be electrically coupled to the LED chips 108 of the LED light engines 104. As shown, the segmented conductor pathway 128 may follow a serpentine pattern across the face of the substrate 124.

The substrate 124 may be any dielectric insulator suitable for a printed circuit board. Substrate 124 may be formed from a prepreg composite material, such a thermoset resin mixed with suitable reinforcement fibers. The substrate materials may include FR-2 (cotton paper and phenolic), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester). Of the foregoing, the substrate 124 may particularly be made from FR-4, particularly to lower cost. Other possible materials may include polyimide, high glass transition (Tg) FR-4, bismaleimide-triazine (BT) resin, cyanate ester, polytetrafluoroethylene (PTFE), and Aramid.

At least a portion of the LED light engines 104 may be electrically coupled in series with the segmented conductor pathway 128, whereby the current to each LED light engine 104 connected in series may be understood to be the same. As shown, all the LED light engines 104 are configured, with pathway 128, as to be in electrical series.

The segmented conductor pathway 128 may also be configured to provide at least one electrical contact 136 or 140 configured to electrically couple the segmented conductor pathway 128 to a power source. More particularly, the segmented conductor pathway 128 may also be configured to provide an electrical contact 136 to receive power from the power source and an electrical contact 140 to return power to the power source. The electrical contact 136 may be a positive contact configured to electrically couple to a positive contact of the power supply, while the electrical contact 140 may be configured as a negative contact configured to electrically couple to a negative contact of the power supply. Thus the segmented conductor pathway 128 may be understood to extend from electrical contact 136 to electrical contact 140. As shown, the pair of electrical contacts 136, 140 may be provided as flat terminals. A portion of the printed circuit board 120 may form at least one card (male) edge connector 132, which may be formed by a discrete projecting portion of substrate 124 and the portion of the segmented conductor pathway 128 which provides electrical contact 136 and/or 140 configured to electrically couple the segmented conductor pathway 128 to the power source. Such may be also referred to as a single piece printed circuit board plug which comprises a series of metal tracks, such as provided by electrical contacts 136, 140 ending near the edge and on the surface of the printed circuit board 120, allowing it to be plugged into a card edge receptacle 242 to provide electrical contacts for power and data transmission.

Figure 16:
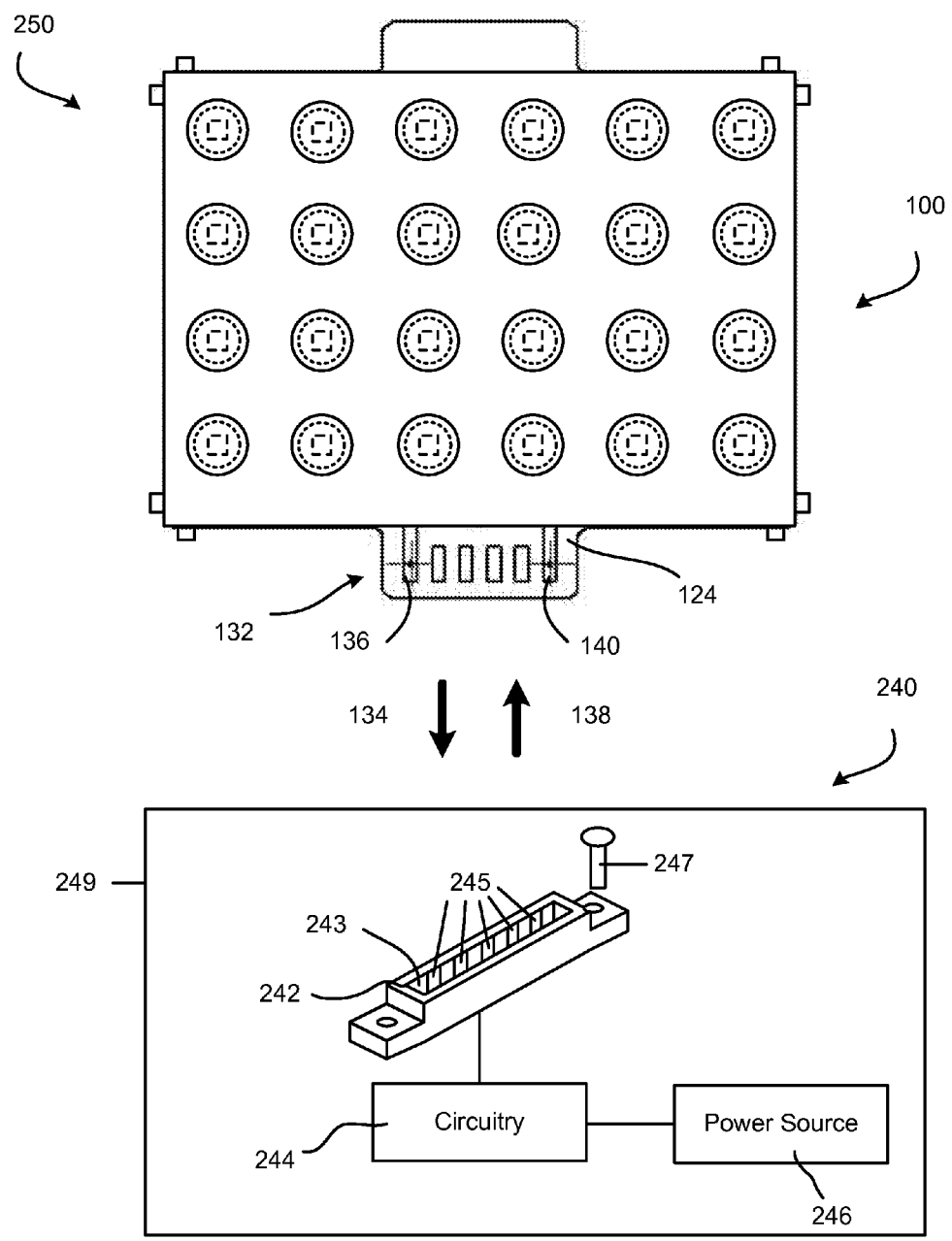
FIG. 16 is a schematic view of the lighting apparatus of FIG. 1 which may be coupled to a lighting fixture to provide a lighting system consistent with the present disclosure.

In briefly referring to FIG. 16, the card edge connector 132 may be configured to physically connect (e.g. mechanically via interference fit) and/or electrically couple to a suitable card edge (female) receptacle 242 by being pushed (inserted) therein in the direction 134 to mechanically engage and receive power therefrom, and thereafter deliver the power to the LED chips 108, as well as return power therefrom. Furthermore, the card edge connector 132 is configured to physically disconnect and disengage from the card edge receptacle 242 by being pulled (removed) therefrom in the direction 138 for ease replacement of the LED lighting apparatus 100, or replacement or repair of a portion thereof. The card edge connector 132 also supports the remainder of the printed circuit board 120 in rigid relation to the card edge receptacle 242. As shown, card edge receptacle 242 may comprise an elongated rectangular slot 243 to receive card edge connector 132, and may contain metal contacts 245 to operate with contacts 136, 140. Card edge receptacle 242 may be fastened to a housing 249 of a fixture 240 with a mechanical fastener 247 such as a screw to inhibit movement thereof. Fixture 240 may include multiple lighting apparatus 100.

The use of a printed circuit board 120 with a non-conductive substrate 124 and a card edge connector 132 may provide certain advantages over a metal-clad printed circuit board with a surface mount technology (SMT) connector for electrical contact and mechanical attachment to a fixture. First, the SMT connector may be understood to require use of a high-temperature (260° C.) reflow operation which may discolor the e mask and significantly lower the reflectivity thereof. For those applications requiring a diffuser to deliver uniform output, reduced reflectivity may result in a significant drop in output (lumens). Eliminating the reflow process may result in improved performance of the LED light engine 104.

Additionally, a metal-clad printed circuit board with an SMT connector may be understood to be first installed to a fixture/heatsink with double sided tape and/or screws which extend through thru-holes in the metal-clad printed circuit into the fixture/heat sink. Attachment of the metal-clad printed circuit board with double sided tape and/or screws is meticulous and time consuming, and may lead to damage to the LED light engines with a slip of a screw driver. Once the metal-clad printed circuit board is mechanically attached to the fixture with screws, the electronic leads are then plugged into the SMT connector. As a result, mechanical and electrical attachment may be understood to require a two step process. However the use of a card edge connector 132 allows both mechanical and electrical connection of the LED lighting apparatus 100 in a single step/operation to a fixture 240 (in this case the fixture 240 may include the circuitry 244 and a power supply 246 to operate lighting apparatus 100).

It should be recognized that most LED modules are built on metal-clad printed circuit boards (aluminum backed) and are designed for thru-board cooling. Typically these modules are directly attached to a heat sink using thermal paste to sink the heat from the LEDs into the fixture. Metal-clad printed circuit boards may be understood to preclude the use of a card-edge connector 132 because the aluminum backside of the printed circuit board may short circuit the module (the card-edge connector 132 may be understood to contact both the frontside and backside of the printed circuit board. Furthermore, since cooling is achieved on the frontside of the present design, and does not require any thru-board (substrate) cooling, the heat sink of a metal-clad circuit board, as well as the use of the aluminum backing is not required. Consequently, this permits use of card-edge connector 132 because the printed circuit board substrate 124 is an insulator and will not short circuit on the backside. Moreover, using thru-holes to attach the module to the fixture is meticulous, time consuming, and prone to damaging the LED light engines 104. Such issues could be eliminated by using a card-edge connector 132 to attach the LED lighting apparatus 100 to a fixture 240 (in this case the fixture 240 may include the circuitry 244 and a power supply 246 to operate lighting apparatus 100).

Referring back to FIG. 2, the segmented conductor pathway 128 may be etched from a planar metal sheet, such as a copper sheet, laminated onto the substrate 124. The planar metal sheet may particularly have a weight in a range of and all increments between 0.5 to 4 ounces per square foot. The planar metal sheet may particularly have a thickness in a range of and all increments between 15-150 µm.

The segmented conductor pathway 128 may be formed by a plurality of electrically conductive segments 144 which may be electrically coupled to the LED chips 108 as explained in greater detail below. The electrically conductive segments 144 may include any suitable shape, such as being elongated, rectangular and/or square. As shown, certain larger pad portions 148 of the electrically conductive segments 144 may be particularly configured to operate as heat sinks, via a particularly large surface area, to remove heat laterally from the LED chips 108, rather than through the substrate 124.

Consequently, heat may be removed from each of the LED light engines 104 without need for heat transfer to a separate heat sink on the back side of the printed circuit board 120. With the illustrated design, heat may be transferred laterally away from each of the LED light engines 104 by the segmented conductor pathway 128. Thus, the segmented conductor pathway 128 serves two purposes, to provide the LED light engines 104 with electrical power and to transfer heat away from the LED light engines 104. In serving this dual purpose, the efficiency of the design is increased and the cost of a separate heat sink is eliminated.

Electrically conductive segments 144, and in particular heat sink pad portions 148, may be particularly configured to transfer heat away from LED light engines 104 by conduction and thereafter convection. More particularly, electrically conductive segments 144, and in particular heat sink pad portions 148, may be configured to transfer heat away from LED light engines 104 with suitable thermal transfer such that a junction temperature of the LED light engines 104 may be maintained below and may not exceed 125° C. when operated at a predetermined maximum power rating. The junction temperature may be understood as the temperature at the light emission point of the LED light engines 104 or the p-n junction.

Even more particularly, electrically conductive segments 144, and in particular heat sink pad portions 148, may be configured to transfer heat away from LED light engines 104 such that a junction temperature of the LED light engines 104 may be maintained below and may not exceed 50° C. In order to provide a junction temperature of 50° C., electrically conductive segments 144 may have a surface area of at least 90 mm² (square millimeters). From the foregoing, it should be understood that various maximum junction temperatures may be achieved in the range between 50° C. to 125° C. (e.g. 55° C., 60° C., 65° C., 70° C., 75° C., 80° C., 85° C., 90° C., 95° C., 100° C., 105° C., 115° C., 120° C.) with smaller sized electrically conductive segments 144, whereby the spatial density of LED light engines 104 may be increased if desired.

Figure 3:
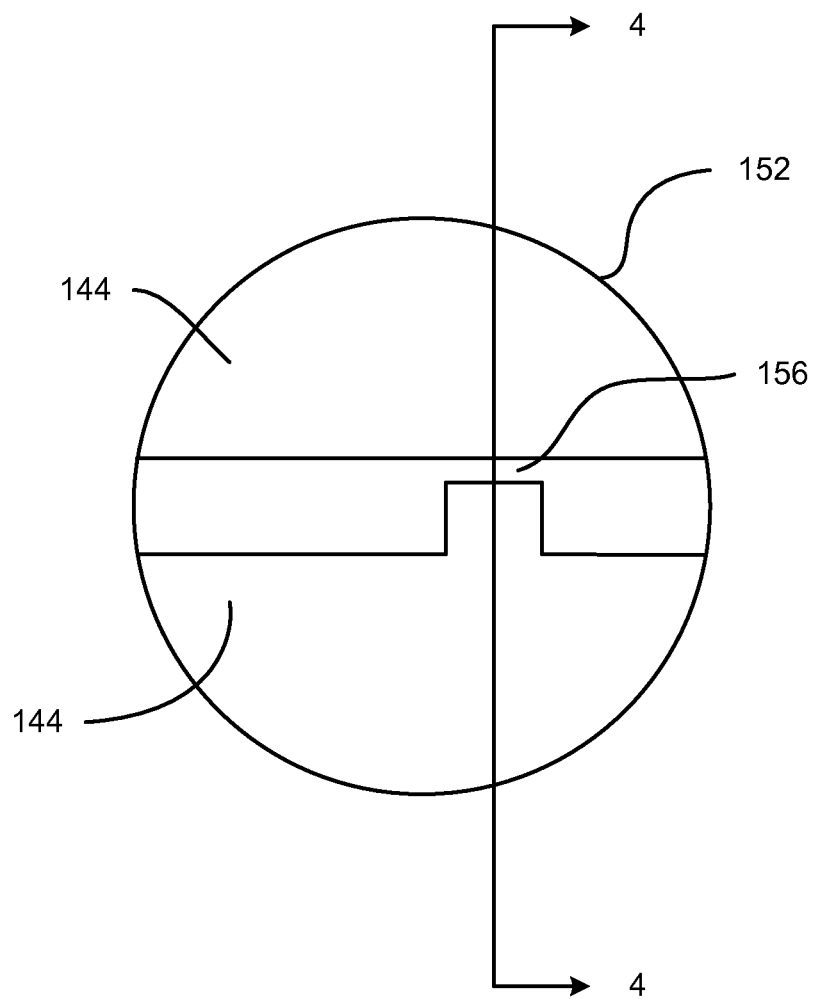
FIG. 3 is a close-up schematic front plan view of the portion of the printed circuit board bound by circle 152 of FIG. 2.
Figure 4:
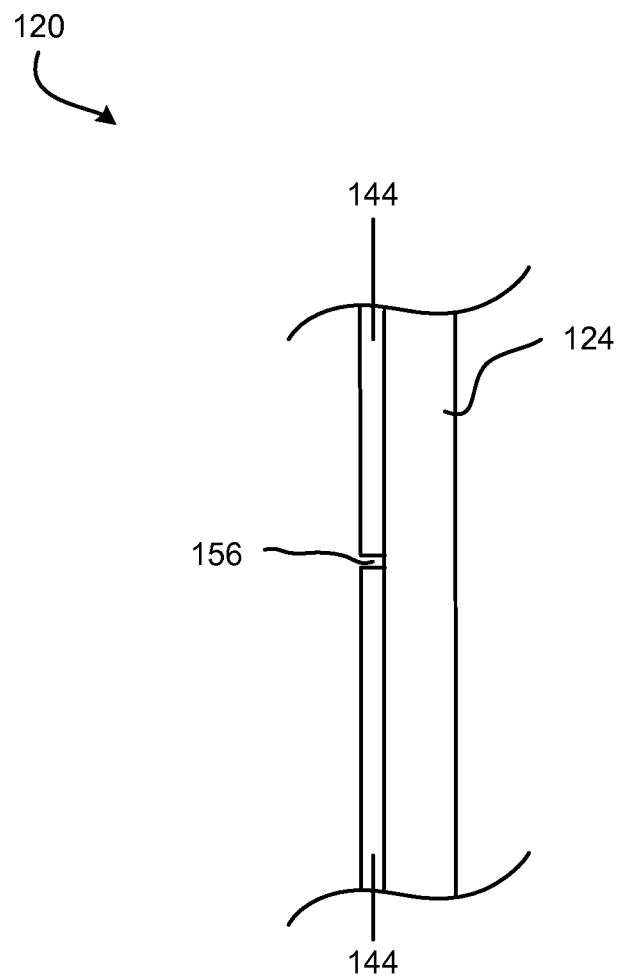
FIG. 4 is a close-up schematic cross-sectional view of the portion of the printed circuit board bound by circle 152 of FIG. 2.

Referring now to circle 152, which is enlarged in FIG. 3 and a cross-section of which is shown in FIG. 4, adjacent electrically conductive segments 144 are separated by a gap 156. When assembled to printed circuit board 120, the LED chips 108 are used to form a bridge to electrically couple adjacent electrically conductive segments 144 so as to make the segmented conductor pathway 128 continuous from the electrical contact 136 to the electrical contact 140, which may then provide an electrically conductive circuit therebetween.

Figure 5:
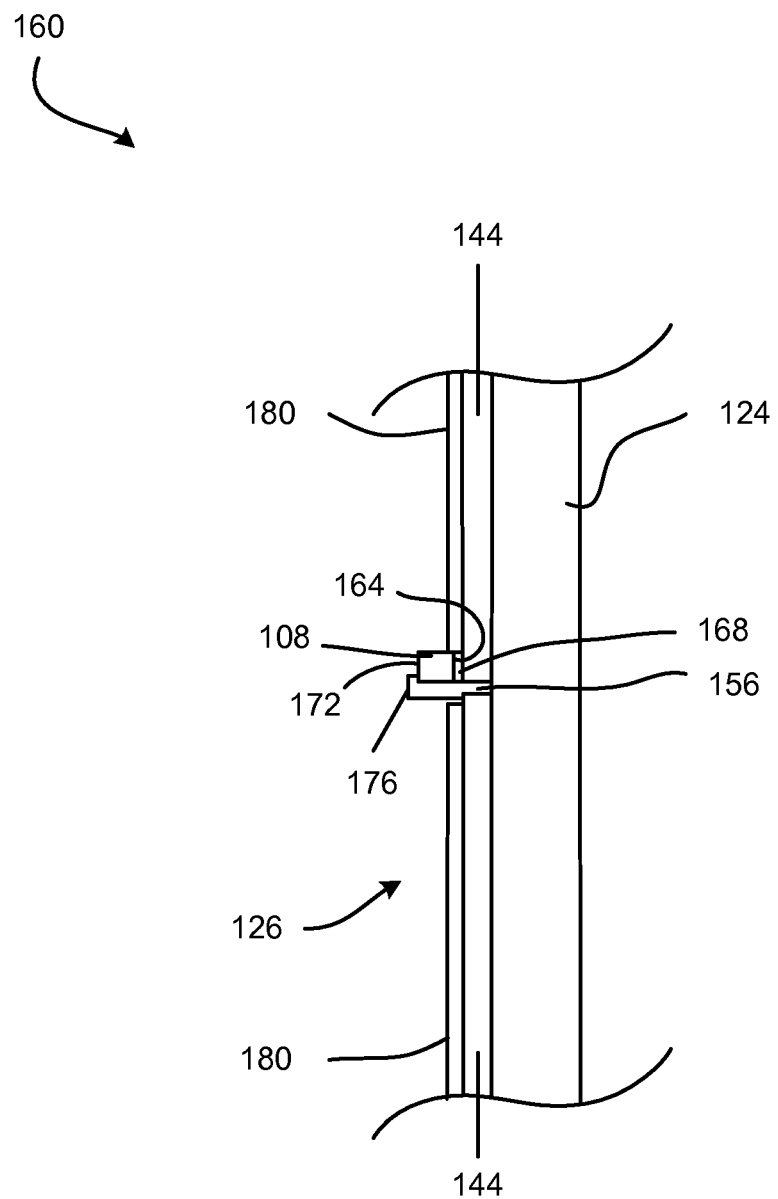
FIG. 5 is a close-up schematic cross-sectional view of the portion of the printed circuit board bound by circle 152 of FIG. 2 with an LED chip mounted thereto to provide an LED substrate module.

Referring now to FIG. 5, the LED chips 108 are shown to have been mounted to the printed circuit board 120. When the printed circuit board 120 is populated with the LED chips 108, such may be referred to herein as a LED substrate module 160. Alternatively, the LED substrate module 160 may be referred to as a chip-on-board (COB) printed circuit board assembly, LED printed circuit assembly or LED printed circuit board assembly.

The LED chips 108 may include a first electrical contact 164, which may be located on the bottom or base of the LED chips 108 and correspond to an anode, to receive power from the power supply through the electrically conductive segment 144 to which it is mounted. The LED chips 108 may be mounted to the electrically conductive segment 144 by an electrically conductive bonding agent 168, such as a silver-filled epoxy resin, located between electrical contact 164 and electrically conductive segment 144. A second electrical contact 172 may be located on the top of the LED chip 108 and correspond to a cathode, to return power to the power supply through an adjacent electrically conductive segment 144. The LED chips 108 may be connected to the adjacent electrically conductive segment 144 by a bonding wire 176 which may be connected using a wire bonding machine.

Alternatively, both electrical contacts 164 and 172 may be located on the bottom of LED chip 108, (electrically isolated from one another) with one contact on each side of gap 156 and mounted to separate electrically conductive segments 144 whereby electrical contact 164 may receive power through one electrically conductive segment 144 and electrical contact 172 may return power through another electrically conductive segment 144. In this manner, bonding wire 176 may be eliminated.

Other than the locations where the LED chips 108 are mounted to the substrate 124 and the electrical connections therefore (i.e. the card edge connector 132 with electrical contacts 136, 140), the front side 126 of the substrate 124 to which the electrically conductive segments 144 are bonded may be covered with an electrically insulative material 180, such as may be provided by a solder mask coating. The electrically insulating coating 180 may be particularly colored to match the light to be provided by the LED light engine 104 and be a reflective coating. Thus, electrically insulative coating 180 may particularly be a white electrically insulative coating, which may be provided by a white solder mask coating, such as Taiyo PSR4000 LEW1.

Figure 6:
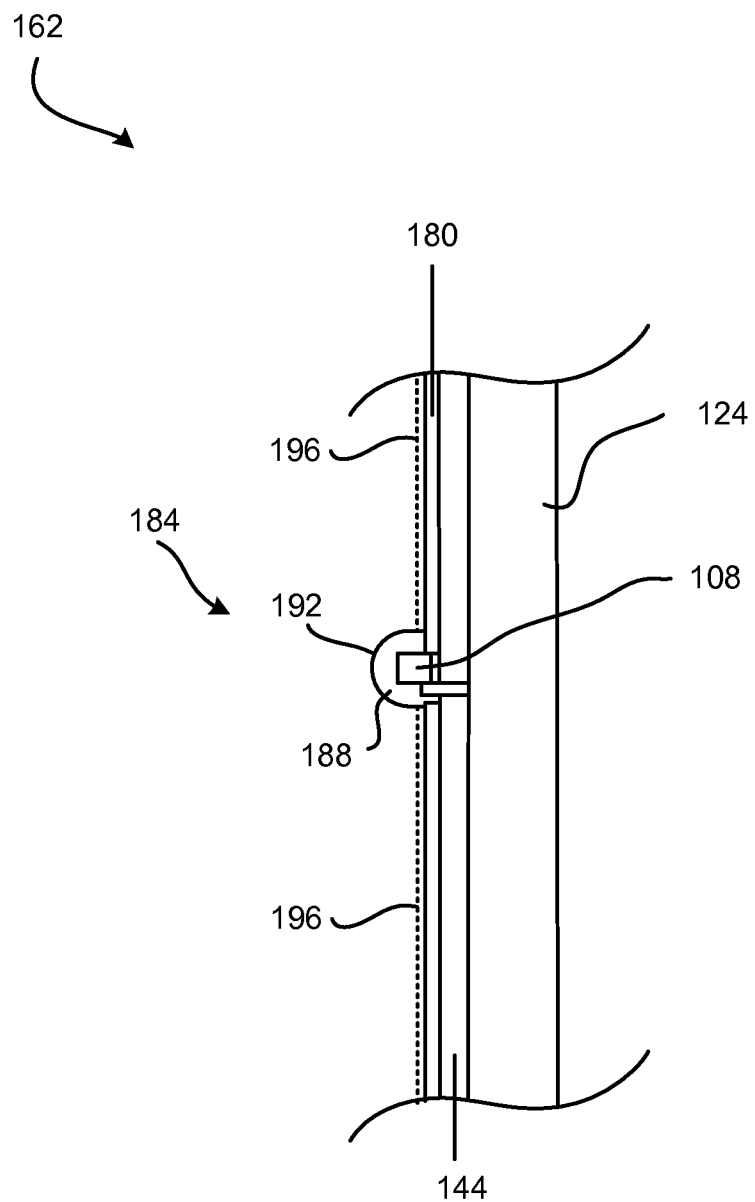
FIG. 6 is a close-up schematic cross-sectional view of the portion of the printed circuit board bound by circle 152 of FIG. 2 with a first optic element overlying an LED chip.

Referring now to FIG. 6, after application of the electrically insulating coating 180 and the subsequent placing of the LED chips 108 and wire bonds 176, the array of the LED chips 108 may be covered with an array of the first optic elements 184. More particularly, the array of the first optic elements 184 overlies the array of the LED chips 108, with one of each of the LED chips 108 located within one of each of the first optic elements 184. This may be referred to as the LED base module 162. Preferably there is nothing in the first optic element 184 that would affect the heat budget of the first optic element 184, such as phosphors.

Each of the first optic elements 184 may include a clear (transparent), solid dome 188 overlying each LED chip 108. As used herein, by "transparent" may be understood to mean that the first optic elements 184 have the property of transmitting light through the first optic elements 184 with a low degree of or no scattering. In addition to covering and encapsulating the LED chip 108, the first optic element 184 also may cover and encapsulate the bonding wire 176. In this manner the LED chip 108 and the bonding wire 176 may be protected by the first optic element 184 for subsequent handling, shipping and testing.

The first optic element 184 may be made of a polymer material molded-in-place directly to the printed circuit board 120 and over the LED chip 108, such as by injection molding, compression molding or injection-compression molding. Such may be performed by placing the LED substrate module 160 into the cavity of a mold, and thereafter introducing the polymer material to the cavity which molds directly to the LED substrate module 160 and bonds thereto. Such may also be referred to as insert molding, with the LED substrate module 160 being the insert. In one embodiment, the first optic element 184 may be formed of a flexible, resilient thermosetting polymer material having a relatively high index of refraction, such as silicone (e.g. Dow Corning OE6630), which may be compression molded over the LED chip 108 to encapsulate the LED chip 108.

As shown in FIG. 6, the dome 188 may particularly have a shape of a hemispherical protrusion, with a corresponding hemispherical light emitting surface 192. As used herein, the term "hemisphere" or "hemispherical" refers to any portion of a generally spherical shape and is not limited to exactly one-half of a generally spherical shape. In the illustrated embodiment, the hemispherical shapes of the dome 188 and the light emitting surface 192 have a curvature of about 180 degrees defined by a constant radius. The size of the dome 188 may depend on the particular application and the number of the LED chips 108 on which the dome 188 is to be mounted, and may be, for example, a few millimeters to several centimeters in diameter (e.g. 4-8 mm in diameter and more particularly 6 mm in diameter). Desirably the dome 188 has a standard size or sizes so that a second optic element 200, discussed in greater detail below, may be more universally compatible therewith and facilitate the manufacture of light engines 104 of different emission colors.

Each first optic element 184 overlying an LED chip 108 may be discretely molded (i.e. molded separately or isolated from one another), such as by injection molding. However, to increase the ease of molding the array, at least a portion of the first optic elements 184 may be connected by a thin web 196. More particularly, all the first optic elements 184 may be connected by the web 196.

Figure 7:
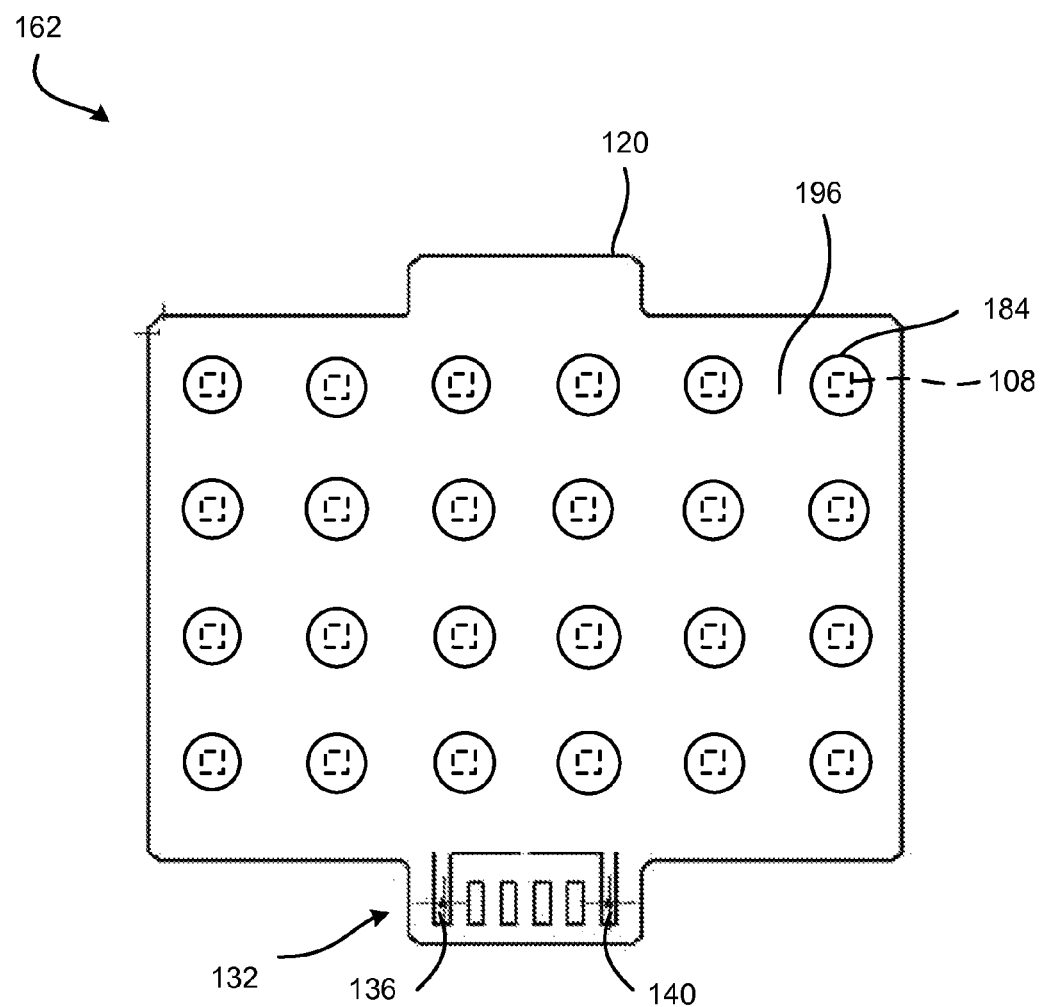
FIG. 7 is a schematic plan view showing the printed circuit board of FIG. 2 with LED chips mounted thereto covered by first optic elements.
Figure 8:
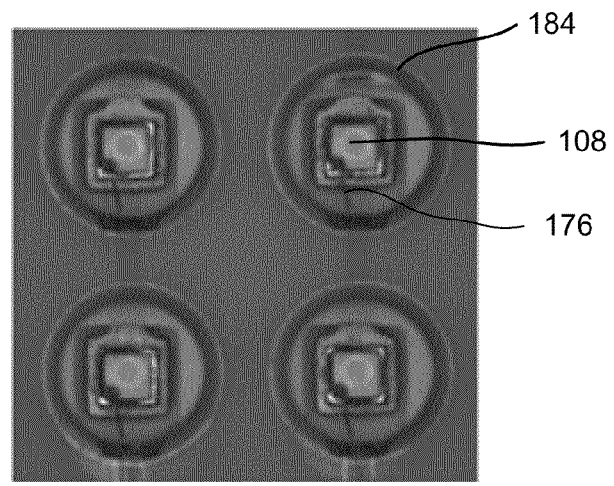
FIG. 8 is a plan view showing a printed circuit board with LED chips mounted thereto covered (encapsulated) by first optic elements.
Figure 9:
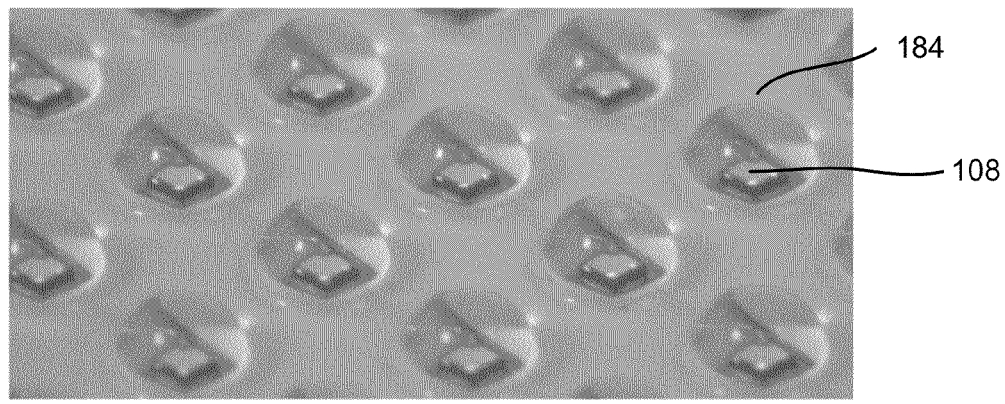
FIG. 9 is a perspective view showing a printed circuit board with LED chips mounted thereto covered (encapsulated) by first optic elements.

Referring to FIG. 7, there is shown the LED base module 162 with the LED chips 108 encapsulated by the first optic elements 184, which are all connected by the web 196 which overlies the electrically insulating coating 180. Similarly, FIGS. 8-9 show 0.5 mm LED chips 108 encapsulated by the first optic elements 184 in a plan view and perspective view, respectively. With the foregoing construction, the LED chips 108 are particularly configured to emit light of a first wavelength range through the light emitting surface 192 of the overlying first optic elements 184. Furthermore, each of the first optic elements 184 may be assembled to the printed circuit board 120 simultaneously as part of a single plastic molding, which may increase the manufacturing efficiency of the LED base module 162.

Figure 10:
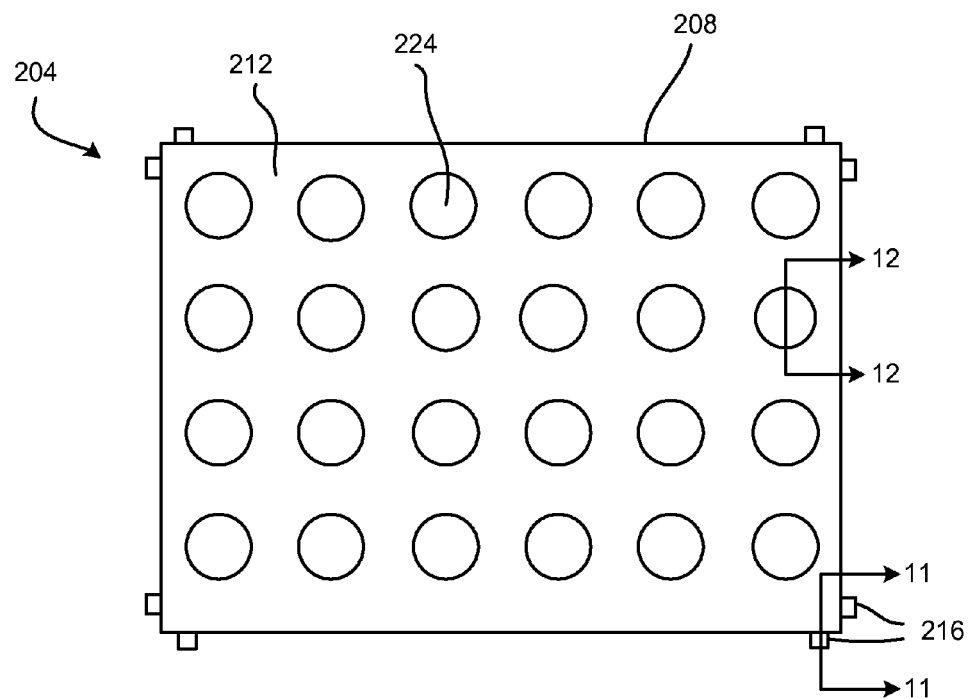
FIG. 10 a schematic plan view of a cover to overlie the LED substrate module.

Briefly referring back to FIG. 1, in order to modify the light emitting characteristics of the LED light engine 104, the first optic element 184 is covered by a second optic element 200. Referring now to FIG. 10, the second optic element 200 may be part of a cover 204 comprising a carrier 208. As shown the carrier 208, may include a planar frame portion 212 configured to overlie base module 162, and at least one connection portion 216 configured to connect with the base module 162.

The carrier 208 may include a rigid thermoplastic polymer material. Exemplary thermoplastic materials may include polycarbonate (PC), acrylonitrile-butadiene-styrene (ABS) or polypropylene (PP) which may be molded by injection molding. The carrier 208 may be made as to be highly reflective in the visible spectrum, such as may be performed by molding the carrier in a reflective color (e.g. white) or by spraying the mold surface with a highly reflective coating prior to injection molding the carrier 208 and thereafter having the carrier 208 coated with the reflective coating after molding. The carrier 208 may also be made as to have high emissivity in the infrared region, and high thermal conductivity, such as by being filled with ceramic or metal powder/particles (e.g. copper, bronze and nickel powder).

Figure 11:
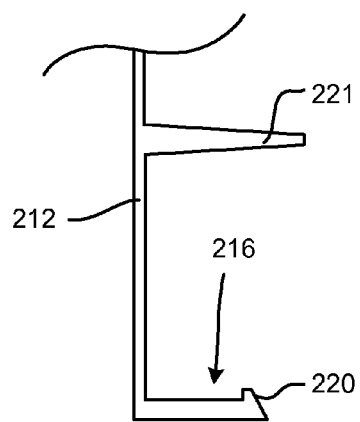
FIG. 11 is a schematic cross-sectional view of a connector portion of a carrier of the cover taken along line 11-11 of FIG. 10.

As best shown in FIG. 11, the connector portions 216 include mechanical engagement members 220 and more particularly cantilevered mechanical engagement members 220 in the form of a snap tabs which are cantilevered from and substantially perpendicular to the planar frame portion 212. As discussed in greater detail below, the mechanical engagement members 220 are configured to mechanically engage with the printed circuit board 120 of the base module 162. As shown, the mechanical engagement members 220 may be located on all sides of the carrier 208 to better ensure proper assembly of the cover 204 with the base module 162.

Alternatively, other connector portions 216 may include a fastener means 221 to extend through a thru-hole in at least the printed circuit board 120. In this manner, the perimeter cantilevered snap tabs may be eliminated and adjacent modules may be more closely placed adjacent one another. For example, the back side of the carrier 208 may include a one or more integral cylindrical protrusions, with each protrusion configured to extend through a hole in the printed circuit board 120. A nut 223 (shown in FIG. 14) may then be attached to the protrusion to fasten the carrier 208 and printed circuit board 120 together. Alternatively, the nut 223 may be eliminated and the cylindrical protrusion may be used as a heat stake pin which is heated and deformed under pressure to form a head which locks the carrier 208 and printed circuit board 120 together. Still, in other embodiments, both the carrier 208 and printed circuit board may include thru-holes configured to align with one another, through which a mechanical fastener such as an elongated fastener, such as threaded (e.g. screw) or expandable (e.g. push pin, push rivet, pin lock) may be inserted and extend through.

The planar frame portion 212 may contain a plurality of circular apertures 224, a cross-section of which is illustrated in FIG. 12. As shown in FIG. 13, the apertures 224 subsequently contain a second optic element 200 attached therein to form an array of second optic elements 200. Each of the second optic elements 200 may have a hemispherical shape of uniform cross-sectional thickness (of about 1-2 mm) with a hemispherical outer surface 228. The second optical elements may also have a hemispherical inner surface 230 defining a hemispherical recess 232 which is configured to provide a receptacle for, and conform to, the hemispherical protrusion of the first optic element 184. Although the illustrated exemplary embodiment includes hemispherically-shaped first 184 and second 200 optic elements, the optic elements 184 and 200 may be of any shape and may be of complementary or non-complementary shapes.

As best shown in FIG. 13A, second optic element 200 may be formed with a rear portion 233 which is offset relative to a rear surface 237 of adjoining planar frame portion 212 (i.e. not flush with rear surface 237) such that rear portion 233 forms a circular raised ridge. More particularly, in the foregoing manner, a rear surface 235 of rear portion 233 may be better ensured to form a contact fit (e.g. compression or interference fit) and corresponding seal with the base module 162 (e.g. with web 196 or, when web 196 is not present, with coating 180).

The second optic elements 200 may be made of a polymer material molded-in-place directly to carrier 208, such as by injection molding, compression molding or injection-compression molding. Such may be performed by placing the carrier 208 into the cavity of a mold, and thereafter introducing the polymer material to the cavity which molds directly to the carrier 208 and bonds thereto. Such may also be referred to as the insert molding, with the carrier 208 being the insert.

The second optic elements 200 may be formed of a flexible, resilient thermosetting polymer material having a relatively high index of refraction, such as silicone, which may be injection molded. The thermosetting polymer material may be filled with a phosphor or a blend of phosphors mixed therein that convert light from the first optic element 184 to light of a different color. The second optic element 200 may be made by mixing the phosphor into a silicone material, where the amount of the phosphor is determined based on a thickness of the second optic element 200, and the compound may be injected into a mold.

For example, a phosphor (for example, a YAG:Ce phosphor) to convert blue light (having a first wavelength range) from the LED chip 108 to yellow light (having a second wavelength range) may be mixed with the polymer to provide volumetric blue light conversion. The yellow light emitted by the phosphor may combine with the residual unconverted blue light from the LED chip 108 to produce an overall white emission from the LED light engine 104. Optionally, additional phosphors may be included such as red-emitting phosphors for increased color warmth. Other suitable phosphors may be used depending on the color of the light of the first wavelength range emitted from the first optic element 184 and the particular color desired that determines the second wavelength range from the second optic element 200.

After the second optic elements 200 are molded to the carrier 208, the cover 204 is ready to be assembled to base module 162. As shown in FIG. 14, the cover 204 may be assembled to the base module 162 by having a lip 222 of the connector portion 216 mechanically engage and overlie the rear side 130 of the substrate 124 of the printed circuit board 120. At substantially the same time, as shown in FIG. 15, a dome 188 of the first optic elements 184 may be configured to mate and operate with the second optic elements 200. More particularly, the first optic elements 184 may enter and be configured to fit within the recesses 232 of the second optic element 200. For example, the first optic elements 184 may enter the recesses 232 of the second optic element 200 such that at least a portion of the hemispherical surface 230 of each second optic element 200 may contact a portion of the hemispherical surface 192 of the first optic element 184.

In order to reduce a likelihood of an air gap existing between the first optic element 184 and the second optic element 200, a liquid 236 may be applied to either or both of the surfaces 192 and 230 of any or all of the first optic elements 184 and the second optic elements 200, respectively, prior to their assembly. The liquid 236 may be sprayed, poured, or otherwise deposited on the surfaces 192, 230 and may include a silicone.

With the foregoing construction, the array of the first optic elements 184 underlies an array of the second optic elements 200, with one of each of the first optic elements 184 underlying one of each of the second optic elements 200. The second optic elements 200 are configured to convert light of the first wavelength to be emitted through the light emitting surface 192 of the underlying first optic element 184 to light of a second wavelength range different from the first wavelength range. As a result, light of the second wavelength is emitted from the array of second optic elements 200 when the array of LED chips 108 is emitting light of the first wavelength.

With the mechanical engagement members 220, the cover 204 is both connectable to the base module 162 by mechanical engagement therewith, as well as removable from the base module 162 by disengagement therewith. In the foregoing manner, should it be desirable to change the color of light emitted from any or all of the light engines 104, the cover 204 may simply be replaced with a new cover including a new set of second optic elements 200.

Alternatively, in certain embodiments, the first optic element 184 may be produced by filling the recess 232 of the second optic element 200 with clear silicone poured therein and thereafter inserting the LED chips 108 as part of the LED substrate 160 into the clear silicone. The whole assembly 100 could then be placed in an oven to heat and cure the clear silicone and bond the assembly together.

Referring now to FIG. 16, the lighting apparatus 100 is shown as part of a lighting system 250. In addition to lighting apparatus 100, the lighting system 250 may include the card edge receptacle 242. As shown, the card receptacle 242 is electrically coupled to circuitry 244 configured to operate the LED lighting apparatus 100, which is electrically coupled to a power source 246 to receive power therefrom. The circuitry 244 may include hardware such as an LED driver and a controller to control the LED driver, as well software to operate the lighting system 250.

Figure 17:
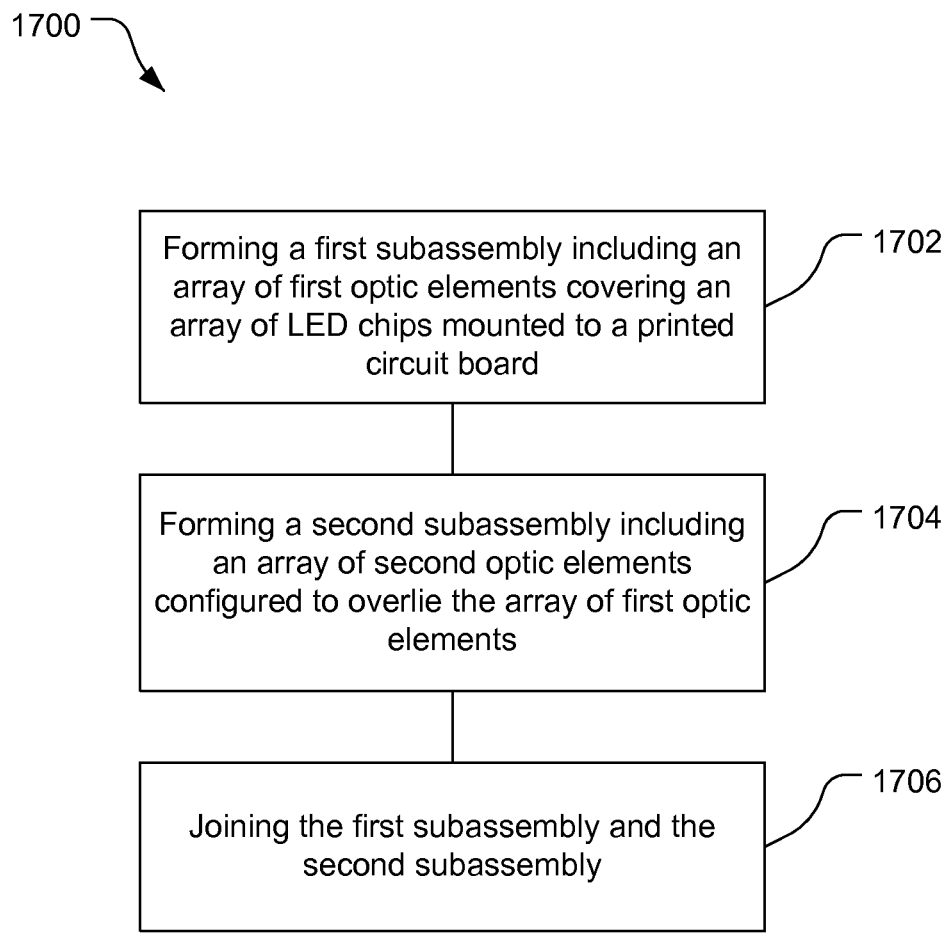
FIG. 17 is a block flow diagram of one exemplary method consistent with the present disclosure.

FIG. 17 is a block flow diagram of one embodiment of a method 1700 of assembling a light emitting diode (LED) lighting apparatus consistent with the present disclosure. The illustrated block flow diagram may be shown and described as including a particular sequence of steps. The illustrated sequence of steps merely provides an example of how the general functionality described herein can be implemented. The steps do not have to be executed in the order presented unless otherwise indicated. In addition, it is to be understood that other embodiments consistent with the present disclosure may include subcombinations of the illustrated steps and/or additional steps described herein. Thus, claims presented herein may be directed to all or part of the components and/or operations depicted in one or more figures.

The illustrated exemplary method includes forming 1702 a first subassembly including an array of first optic elements covering an array of the LED chips mounted to a printed circuit board; forming 1704 a second subassembly including an array of second optic elements configured to overlie the array of first optic elements; and joining 1706 the first subassembly and the second subassembly to provide a lighting apparatus. In one embodiment, for example, the second subassembly may be removably joined to the first subassembly to allow coupling a second subassembly having desired characteristics to the first subassembly. With such a configuration, the first subassembly may be a generic assembly useful with a variety of second subassemblies to allow customization of the light output of the lighting apparatus by selection of the second subassembly.

Thus, the present disclosure provides an improved printed circuit board 120 wherein a segmented conductor pathway 128 serves two purposes: to provide the LED light engines 104 with electrical power; and to transfer heat away from the LED light engine 104. In serving this dual purpose, the efficiency of the design is increased and the cost of a separate heat sink is eliminated.

The present disclosure also provides a lighting apparatus 100 having a connector 132 configured to physically connect and disconnect, and electrically couple to a suitable receptacle 242 to receive power there from, and thereafter deliver the power to the LED chips 108, as well as return power thereto. In the foregoing manner, the connector 132 serves purposes of mechanical and electrical connection. In serving this dual purpose, the efficiency of the design is increased and the cost of separate electrical and mechanical connectors is eliminated.

The present disclosure also provides a lighting apparatus 100 having an array of second optic elements 200, any or all of which may be easily replaced with different second optic elements 200 to change the color of light emitted from any or all of the light engines 104. In this manner, the color of light emitted by any or all of the light engines 104 may be changed without changing the LED module 160 of the LED lighting apparatus 100.

A lighting apparatus and system consistent with the present disclosure may provide certain advantages over the prior art LED light engines. For example, in the present disclosure the second optic element 200 may be separated from the LED chip 108 by the first optic element 184 and thus the phosphor in the second optic element 200 may be less susceptible to lumen degradation caused by the heat from the LED chip 108. Further, since the surface area of the second optic element 200 may be relatively large, the heat from the Stokes shift may spread over a large area and thus the thermal budget of the light engine 104 may be improved. This type of LED light engine 104 may be referred to as a remote phosphor converted LED light engine.

Furthermore, the distributed array approach disclosed herein may be useful in applications targeting a desired efficacy from the LED light engine 104 by "under-driving" a larger number of 0.5 mm LED light engines 104 (instead of the more typical larger 1 mm LED light engines). One conventional approach for the LEDs in general illumination is understood to use as few LED light engines as possible and drive them with the highest permissible drive current to meet the required lumens output while still maintaining a junction temperature consistent with an estimated lifetime, e.g. 50,000 hours. Such an approach results in higher total lumens from the package, but lower efficacy than could be achieved at smaller currents. Additionally, the high luminance of these LED light engines must be addressed to minimize glare while higher input power density requires more sophisticated thermal management strategies. This approach optimizes total lumens per the LED light engine at the expense of efficacy and complicates the task of the lighting engineer to blend the LEDs into a uniform distributed light source.

However, with a distributed array approach consistent with the present disclosure, the printed circuit board 120 may provide the necessary heat sink with no additional thermal management being required. Using more LED chips 108 over a larger area may also preclude the need for complicated and expensive secondary optics. In one embodiment, a distributed array approach consistent with the present disclosure may be governed by selection of drive current to achieve targeted module efficacy without exceeding an input power that can be dissipated by natural convection, e.g. using 0.5 mm LED chips at 12-15 mm spacing for easier blending. By relying on the natural convection from the front face of the lighting apparatus and foregoing thru-board cooling, a system consistent with the present disclosure may use relatively inexpensive, e.g. FR-4, printed circuit boards (PCB) which may provide cost benefit in addition to the design advantages disclosed herein. A system consistent with the present disclosure may also make use of the blue LEDs with chip-on-board (COB) construction to further reduce materials cost and may incorporate relatively small, e.g. 6 mm-diameter, remote phosphor optic elements for conversion to white light.

According to one aspect of the present disclosure, therefore, there is provided a light emitting diode (LED) lighting apparatus. The apparatus may include a printed circuit board having an array of light emitting diode (LED) chips mounted thereto. The printed circuit board may include a segmented conductor pathway configured to electrically couple at least a portion of the array of LED chips and provide an electrical contact configured to electrically couple the segmented conductor pathway to a power source. An array of first optic elements may overlie the array of LED chips, whereby each of the LED chips is configured to emit light of a first wavelength range through a light emitting surface of a different associated one of the first optic elements. An array of second optic elements may overlie the array of first optic elements, whereby each of the second optic elements is configured to convert light of the first wavelength range to light of a second wavelength range different from the first wavelength range.

According to another aspect of the disclosure there is provided a method of assembling a light emitting diode (LED) lighting apparatus. The method includes forming a first subassembly including an array of first optic elements covering an array of LED chips mounted to a printed circuit board; forming a second subassembly including an array of second optic elements configured to overlie the array of first optic elements; and joining the first subassembly and the second subassembly.

According to yet another aspect of the disclosure there is provided a light emitting diode (LED) lighting system including a printed circuit board having an array of light emitting diode (LED) chips mounted thereto. The printed circuit board includes a segmented conductor pathway configured to electrically couple at least a portion of the array of LED chips. A portion of the printed circuit board forms a card edge connector. The card edge connector includes a portion of the segmented conductor pathway which provides an electrical contact configured to electrically couple the segmented conductor pathway to a power source.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible.

What is claimed is:

1. A light emitting diode (LED) lighting system, comprising:
   a lighting apparatus comprising at least one printed circuit board having an array of light emitting diode (LED) chips mounted thereto, the printed circuit board including a segmented conductor pathway configured to electrically couple at least a portion of the array of LED chips;

the segmented conductor pathway including electrically conductive segments, each LED chip being mounted to an electrically conductive segment having a surface area of at least 90 mm$^2$ whereby heat is conducted laterally away from the LED chip to prevent a maximum junction temperature from exceeding 125° C.; and a portion of the printed circuit board forming a card edge connector, the card edge connector including a portion of the segmented conductor pathway which provides an electrical contact configured to electrically couple the segmented conductor pathway to a power source.

2. The system of claim 1 further comprising at least one card edge receptacle to couple with the card edge connector, the card edge connector being configured to be connected to and disconnect from the card edge receptacle.

3. The system of claim 2 wherein the card edge receptacle forms part of a lighting fixture, the lighting fixture including circuitry to operate the lighting apparatus.

4. The system of claim 1 wherein the printed circuit board has a dielectric substrate.

5. The system of claim 1 wherein the segmented conductor pathway is configured to electrically couple at least a portion of the LED chips in electrical series.

6. The system of claim 1 wherein the maximum junction temperature is from 50° C. to 125° C.

7. The system of claim 1 wherein the segmented conductor pathway is configured to dissipate heat through an electrically insulative coating.

8. The system of claim 1 wherein the segmented conductor pathway is configured to dissipate heat through a solder mask.

9. The system of claim 1 wherein the lighting apparatus comprises a plurality of printed circuit boards with each printed circuit board having an array of light emitting diode (LED) chips mounted thereto, each printed circuit board including a segmented conductor pathway configured to electrically couple at least a portion of the array of LED chips; and a portion of each printed circuit board forming a card edge connector, the card edge connector including a portion of the segmented conductor pathway which provides an electrical contact configured to electrically couple the segmented conductor pathway to a power source.

10. The system of claim 9 further comprising a plurality of card edge receptacles to couple with the plurality of card edge connectors.

11. A method of providing a light emitting diode (LED) lighting system, comprising:

providing a lighting apparatus comprising
a printed circuit board having an array of light emitting diode (LED) chips mounted thereto, the printed circuit board including a segmented conductor pathway configured to electrically couple at least a portion of the array of LED chips;

the segmented conductor pathway including electrically conductive segments, each LED chip being mounted to an electrically conductive segment having a surface area of at least 90 mm$^2$ whereby heat is conducted laterally away from the LED chip to prevent a maximum junction temperature from exceeding 125° C.; and a portion of the printed circuit board forming a card edge connector, the card edge connector including a portion of the segmented conductor pathway which provides an electrical contact configured to electrically couple the segmented conductor pathway to a power source;

providing a card edge receptacle, the card edge receptacle configured to mechanically and electrically couple with the card edge connector, the card edge receptacle including an electrical contact to electrically couple with the card edge connector electrical contact and provide power from the power source to the lighting apparatus; and mechanically and electrically coupling the card edge connector to the card edge receptacle such that the card edge connector electrical contact makes contact with the card edge receptacle electrical contact.

12. The method of claim 11 wherein the card edge receptacle comprises a slot which receives the card edge connector, and the card edge receptacle electrical contact is within the slot.

13. The method of claim 11 wherein the card edge connector is configured to be connected to and disconnect from the card edge receptacle.

14. The method of claim 11 wherein the card edge connector protrudes on a side of the printed circuit board.

15. The method of claim 11 wherein the card edge receptacle forms part of a lighting fixture, the lighting fixture including circuitry to operate the lighting apparatus.

16. The method of claim 15 wherein the lighting fixture includes a housing, and the card edge receptacle is fastened within the housing.

17. The method of claim 11 wherein the printed circuit board has a dielectric substrate.

18. The method of claim 11 wherein the segmented conductor pathway is configured to electrically couple at least a portion of the LED chips in electrical series.

19. The method of claim 11 wherein the maximum junction temperature is from 50° C. to 125° C.

* * * * *